United States Patent [19]

Toth

[11] 4,086,502
[45] Apr. 25, 1978

[54] SENSING CIRCUIT

[75] Inventor: Leslie J. Toth, Toledo, Ohio

[73] Assignee: Botelco, Toledo, Ohio

[21] Appl. No.: 740,867

[22] Filed: Nov. 11, 1976

[51] Int. Cl.$^2$ ............................................ H03K 17/00
[52] U.S. Cl. ...................................... 307/308; 307/253; 307/297
[58] Field of Search ............... 307/308, 310, 311, 230, 307/229, 253, 297

[56] References Cited

U.S. PATENT DOCUMENTS

| | | | |
|---|---|---|---|
| 2,757,243 | 7/1956 | Thomas | 307/310 |
| 3,473,043 | 10/1969 | James | 307/230 |
| 3,510,696 | 5/1970 | Bargen et al. | 307/308 |

Primary Examiner—Stanley D. Miller, Jr.
Assistant Examiner—B. P. Davies
Attorney, Agent, or Firm—Allen D. Gutchess, Jr.

[57] ABSTRACT

A sensing circuit is provided that is exceptionally sensitive. The circuit can respond to a minute change in a signal to actuate an electrically-operated device. The circuit is relatively simple, uses inexpensive components, and is compact.

9 Claims, 3 Drawing Figures

SENSING CIRCUIT

This invention relates to a sensing circuit for responding to a signal to operate an electrically-operated device.

The sensing circuit embodying the invention is extremely sensitive to a signal from a sensor or sensing device to actuate a low current, electrically-operated device which can be in the form of a relay, an indicator lamp, a light-emitting diode, delay switches, or various power output systems, by way of example.

The new sensing circuit is relatively low in cost and involves relatively few components which are readily available. The circuit is also compact and can be embodied in a very small space to make its applicability to many uses even more widespread.

It is, therefore, a principal object of the invention to provide an extremely sensitive sensing circuit having the advantages outlined above.

Many other objects and advantages of the invention will be apparent from the following detailed description of preferred embodiments thereof, reference being made to the accompanying drawings, in which.

Figure 1:
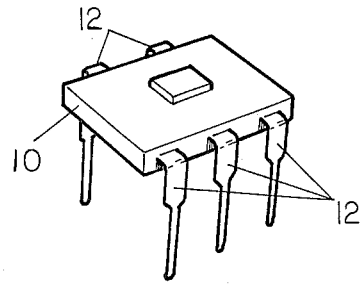
FIG. 1 is a view in perspective of a commercial embodiment of the new sensing circuit.

Referring to FIG. 1, a commercial embodiment of the invention is shown as constituting a body 10 in the form of a rectangular parallelopiped which includes the components of the circuit in an epoxy matrix with all but the power source being contained therein. The body 10 has five leads 12 extending therefrom and positioned to be plugged into a standard 14 pin socket, if desired. The actual body 10 measures only 0.38 inches wide and 0.44 long.

Figure 2:
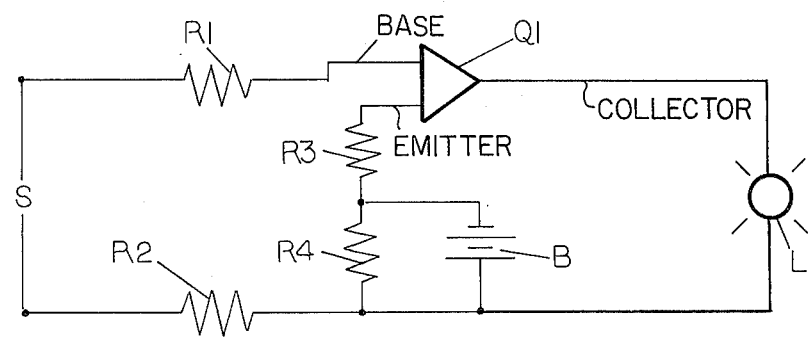
FIG. 2 is a diagrammatic view of a sensing circuit according to the invention.

Referring to FIG. 2, the sensing circuit according to the invention receives a signal from a suitable sensing device or sensor S and when the signal is of a predetermined magnitude, the circuit actuates a low current, electrically-operated device shown in the form of a load or lamp L. As discussed earlier, the load L can take many forms and can include such components as relays, indicator lamps, light-emitting diodes, delay switches, and various power output systems, such as electrical motors and the like which are actuated by switches controlled by the circuit.

The sensor S can produce a change in resistance or produce a voltage for the circuit. While the applications are almost unlimited, by way of illustration, the sensor S can be a liquid-sensing device, a microphone, an ultraviolet ray sensor, a temperature sensor, a humidity sensor, a photocell, a thermistor, etc. The circuit is so sensitive that when an ultraviolet ray sensor is passed under a human hand, the changes in the ultraviolet rays passing through the hand can cause the circuit to actuate a lamp, for example, with the lamp being turned on and off as the intensity of the ultraviolet rays vary due to changes in density in the hand. With this extreme sensitivity, it would even be possible to provide a multiplicity of the ultraviolet ray sensing devices in a given pattern to produce a picture somewhat like an X-ray of the hand. This would have the advantage that X-rays would not be involved which can cause health problems, as is well known.

The circuit in its basic form of FIG. 2 includes a DC power source, e.g. a battery B, in this instance, and a silicon signal transistor Q1 which is of the NPN type and constitutes a direct-coupled DC amplifier. When the signal is of sufficient magnitude the base of the transistor Q1 becomes positive and Q1 conducts to energize the load or lamp L through the collector. A resistor R1 in the base leg of the transistor Q1, between the transistor and the sensor, is primarily a series resistor to prevent damage to the transistor from a surge of "spike" of voltage or error in wiring. A resistor R2, between the sensor and the power source, can be of various values depending upon the sensor employed, with the resistor R2 constituting a compensating one which can be of larger value with sensors of lower resistance and vice versa. A resistor R3, between the power source and the emitter of the transistor, stabilizes the transistor to prevent oscillation thereof. Finally, a resistor R4 across the power source B constitutes a sensitivity resistor which is used to tune or maintain the sensitivity of the circuit relative to changes in the magnitude of the sensing device.

To set forth a specific form of the circuit, by way of illustration, the transistor Q1 is a silicon signal transistor and the DC power source is six volts, with a range of 3 to 36 volts being suitable for the specific transistor employed. The resistor R1 has a value of one K ohms, the resistor R2 is ten K ohms, the resistor R3 is fifty ohms and the resistor R4 is one meg ohm.

It will be readily understood that if a PNP transistor is used, the poles of the direct current power source will be reversed and the circuit will be equally functional as that shown.

Figure 3:
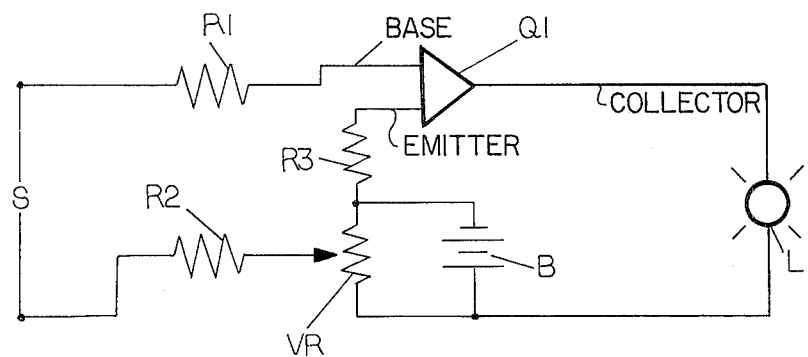
FIG. 3 is a diagrammatic view of a slightly modified sensing circuit according to the invention.

The circuit of FIG. 3 differs from that of FIG. 2 in that it can be used with a variety of applications without changes in the resistors, whereas the circuit of FIG. 2, with the fixed resistor R4, is specifically tuned to a specific application. In FIG. 3, the circuit is similar to that of FIG. 2 with the exception that a potentiometer or variable resistor VR is substituted for the resistor R4. Once the potentiometer is set to a given position for a particular application, it does not require further change.

Various modifications of the above-described embodiments of the invention will be apparent to those skilled in the art, and it is to be understood that such modifications can be made without departing from the spirit and scope of the invention, if they are within the spirit and the tenor of the accompanying claims.

I claim:

1. Sensing and actuating means for actuating an electrically-operated device when receiving a signal of a given magnitude from a variable sensor, said sensing and actuating means comprising an electrically-operated device, a source of DC power, a first conductor connecting one side of said source to the sensor, a first resistor connected in series between said source and said sensor, a silicon transistor, a second conductor connecting the other side of said source and the emitter of said transistor, a second resistor connected in series between said source and the emitter of said transistor, a third resistor connected to said first conductor and said second conductor across said source, a third conductor connecting said sensor and the base of said transistor, a fourth conductor connecting the collector of said transistor and said electrically-operated device, and a fifth conductor connecting said electrically-operated device and said one side of said source.

2. Sensing and actuating means according to claim 1 wherein said third resistor is variable.

3. Sensing and actuating means according to claim 1 characterized by a fourth resistor connected in series with said sensor and the base of said transistor.

4. Sensing and actuating means according to claim 1 characterized by said transistor being an NPN type with said second conductor connecting the negative side of said source and said transistor.

5. Sensing and actuating means for actuating an electrically-operated device in response to a signal the circuit receives from a variable sensor, said sensing and actuating means comprising an electrically-operated device, a source of DC power, a transistor, a first conductor for connecting one side of the power source with said sensor, a compensating resistor in said first conductor, a second conductor connecting the other side of said power source and the emitter of said transistor, a stabilizing resistor in said second conductor, a sensitivity resistor connected to said first conductor and said second conductor across said power source, a third conductor connecting said sensor and the base of said transistor, a fourth conductor connecting the collector of said transistor and the electrically-operated device, and a fifth conductor connecting said electrically-operated device and the one side of said power source.

6. Sensing and actuating means according to claim 5 characterized by said sensitivity resistor being a variable resistor.

7. Sensing and actuating means according to claim 5 characterized by a protective resistor being located in said third conductor.

8. Sensing and actuating means according to claim 5 characterized by said power source being a battery.

9. Sensing and actuating means according to claim 5 characterized by said circuit components, except for said power source, being contained in a compact rectangular parallelopiped.

* * * * *